United States Patent
Satoh

(10) Patent No.: US 7,333,217 B2
(45) Date of Patent: Feb. 19, 2008

(54) SYSTEM AND METHOD FOR DETECTING AND CORRECTING POSITION DEVIATIONS OF AN OBJECT HAVING A CURVED SURFACE

(75) Inventor: Ichitaroh Satoh, Tokyo (JP)

(73) Assignee: Yamatake Corporation, Tokyo (JP)

( * ) Notice: Subject to any disclaimer, the term of this patent is extended or adjusted under 35 U.S.C. 154(b) by 146 days.

(21) Appl. No.: 10/538,978

(22) PCT Filed: Dec. 20, 2002

(86) PCT No.: PCT/US02/40788

§ 371 (c)(1),
(2), (4) Date: Jun. 14, 2005

(87) PCT Pub. No.: WO2004/059245

PCT Pub. Date: Jul. 15, 2004

(65) Prior Publication Data

US 2006/0050940 A1    Mar. 9, 2006

(51) Int. Cl.
*G01B 11/14* (2006.01)
(52) U.S. Cl. ..................................... 356/614
(58) Field of Classification Search ............... 356/614, 356/615, 624; 250/559.29, 559.3
See application file for complete search history.

(56) References Cited

U.S. PATENT DOCUMENTS

| | | |
|---|---|---|
| 5,489,966 A | 2/1996 | Kawashima et al. |
| 5,648,854 A | 7/1997 | McCoy et al. |
| 5,945,725 A * | 8/1999 | Ishikawa ............... 257/531 |
| 5,955,776 A * | 9/1999 | Ishikawa ............... 257/618 |
| 5,995,199 A | 11/1999 | Shinozaki et al. |
| 5,999,245 A | 12/1999 | Suzuki |
| 6,148,270 A | 11/2000 | Nakajima et al. |
| 6,178,654 B1 | 1/2001 | Kanatake |
| 6,251,550 B1 | 6/2001 | Ishikawa |
| 6,262,791 B1 | 7/2001 | Powell |
| 6,265,234 B1 * | 7/2001 | Mei ............................ 438/14 |
| 6,509,645 B2 * | 1/2003 | Tatsumi et al. .......... 257/738 |

* cited by examiner

*Primary Examiner*—Roy M Punnoose
(74) *Attorney, Agent, or Firm*—Robert D. Atkins; Quarles & Brady LLP

(57) ABSTRACT

A position deviation system and method detects and corrects position deviations between the optical axis of an optical system, such as an exposure apparatus, and the center of a curved shaped object, such as a spherical shaped semiconductor. The system determines position deviations by illuminating the curved surface, passing light that is reflected off of the illuminated curved surface through a first lens having an optical axis and a first body. An image having a substantially central portion is formed on a surface using the reflected light. The position deviation is determined based on a position of the substantially central portion of the formed image relative to the optical axis.

26 Claims, 8 Drawing Sheets

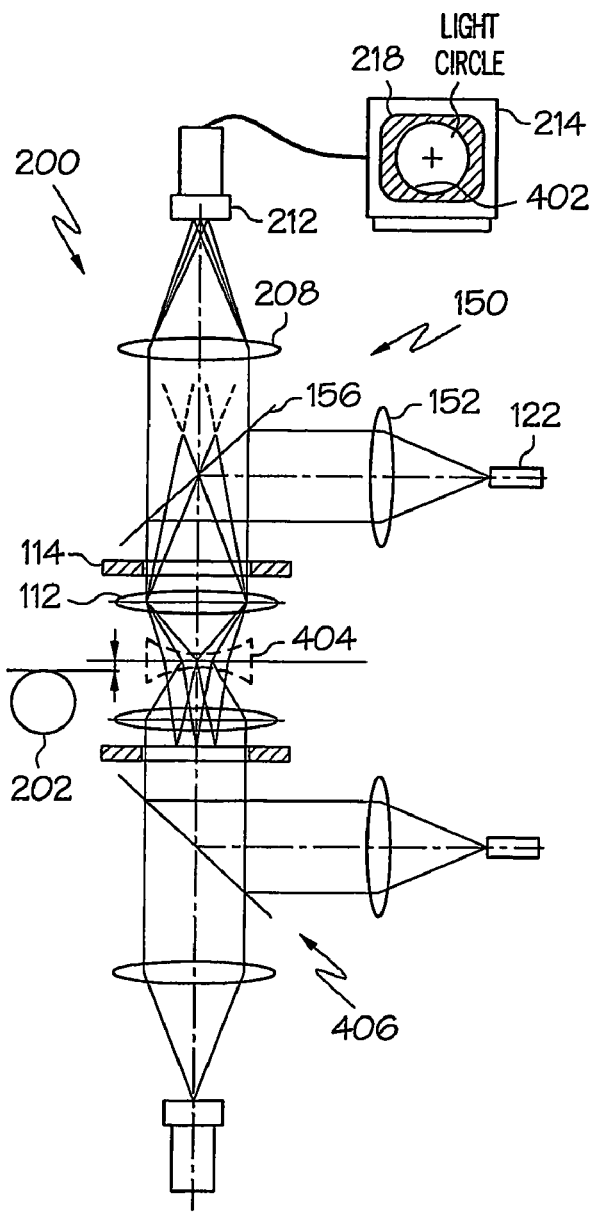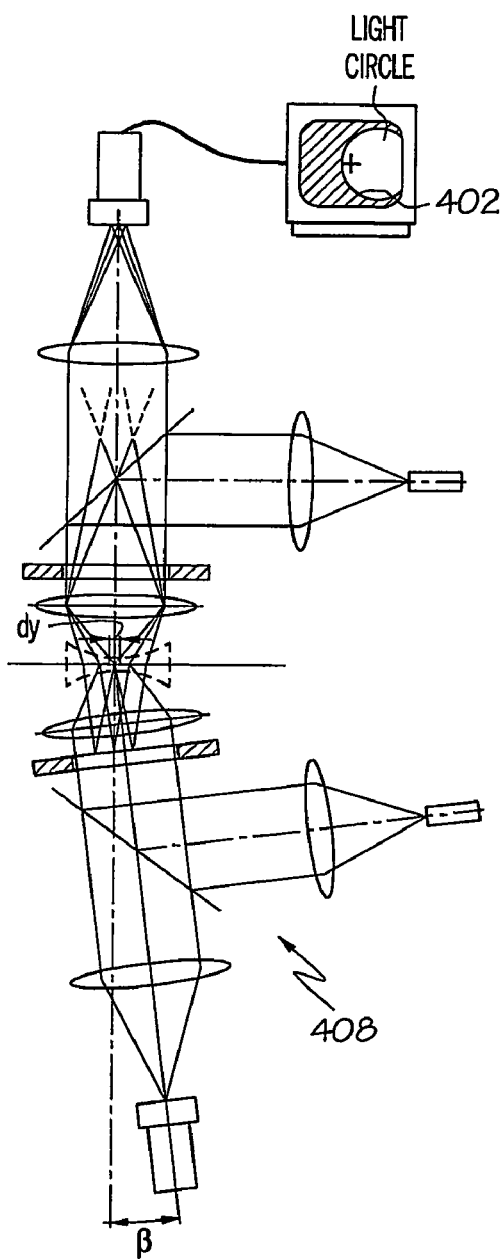
FIG. 4A
FIG. 4B

US 7,333,217 B2

SYSTEM AND METHOD FOR DETECTING AND CORRECTING POSITION DEVIATIONS OF AN OBJECT HAVING A CURVED SURFACE

CLAIM TO DOMESTIC PRIORITY

This application is a U.S. National Stage Application filed under 35 U.S.C. 371 claiming priority from the International Application No. PCT/US2002/040788, filed Dec. 20, 2002, which application is incorporated herein by reference.

FIELD OF THE INVENTION

The present invention relates to a system and method for detecting position deviations of an object having one or more curved surfaces and, more particularly, to a system and method for detecting position deviations between the optical axis of the position deviation detecting system and the center of the object, such as a spherical semiconductor.

BACKGROUND OF THE INVENTION

Semiconductor devices are used in many types of products. Typically, semiconductor devices are manufactured by first growing generally cylindrical-shaped silicon (or other base semiconductive material) ingots. The ingots may then be sliced into generally flat, circular wafers; Through a variety of thermal, chemical, and physical processes, including diffusion, oxidation, epitaxial growth, ion implantation, deposition, etching, sputtering, polishing, and cleaning, active and passive devices may be formed on one or both surfaces of the wafer. The wafer may then be cut into individual rectangular semiconductor die, which may then be attached to a leadframe, encapsulated, and packaged as a discrete or integrated circuit. The packaged discrete and integrated circuits may be mounted to printed circuit boards and interconnected to perform the desired electrical function.

More recently, another type of semiconductor integrated circuit device, known as a spherical shaped integrated circuit, has emerged. Spherical shaped integrated circuits provide various advantages over conventional flat integrated circuits. For example, the physical dimensions of spherical integrated circuit allow it to adapt to many different manufacturing processes. Moreover, due to its shape, spherical shaped integrated circuits shape have greater surface area as compared to conventional integrated circuits. Hence, a spherical integrated circuit may have more (or larger) circuits and circuit elements formed on its surface, as compared to a conventional, flat integrated circuit. A spherical shaped integrated circuit may be manufactured by using a variety of conventional thermal, chemical, and physical processing steps.

A system and method for manufacturing spherical shaped integrated circuits is disclosed in U.S. Pat. No. 5,955,776 ("Ishikawa"). In accordance with Ishikawa, once the spherical semiconductor crystals are formed, each undergoes a variety of conventional thermal, chemical, and physical processes. Thereafter, the circuit elements are formed in the spherical surface using the same basic processing steps that are used to form circuit elements on conventional, flat integrated circuits. In particular, a photoresist is applied to the surface of the sphere. Then, using an exposure apparatus, light from a light source is irradiated through a mask onto the spherical surface. The mask has a circuit pattern formed on it and, as a result, this circuit pattern is projected onto the surface of the spherical shaped semiconductor. The masked light reacts with the photoresist to form the desired circuit on the surface of the sphere.

To ensure that the circuit pattern is projected on the surface of the spherical shaped semiconductor with sufficient precision, the center of the spherical shaped semiconductor should coincide with the optical axis of the exposure apparatus before exposing the surface to the masked light. One method of providing proper alignment is to form alignment marks on the surface of the spherical shaped semiconductor. These alignment marks are used to detect and correct any position deviations, and properly position the spherical shaped semiconductor on a support stand. The support stand is then moved to the appropriate position in the exposure apparatus, such that the optical axis of the exposure apparatus coincides with the center of the spherical-shaped semiconductor.

Although the above-described positioning process generally works well, it does exhibit certain drawbacks. In particular, if the position of the alignment marks is sensed using an optical sensing device, it may not be possible to detect position deviations with a sufficiently high degree of sensitivity. This can be seen by referring to FIGS. 8 and 9. As FIG. 8 illustrates, when the alignment mark 802 on the surface of the spherical shaped semiconductor 804 coincides with the optical axis 806 of an optical system such as, for example, an exposure apparatus, the width of the alignment mark 802 is seen as being W0 by an optical sensing device. Conversely, as FIG. 9 illustrates, a slight counterclockwise rotation of the spherical shaped semiconductor 804 causes a deviation (dy). If the spherical shaped semiconductor 804 is then rotated clockwise so that the width of the alignment mark is seen as W0, then the deviation (dy) will still exist between the center of the alignment mark and the optical axis 806. Thus, the spherical shaped semiconductor 804 may be translated until the center of the alignment mark coincides with the optical axis 806, and the width of the alignment mark is seen as being W1. For example, as illustrated in FIG. 9, when an incremental position deviation ("dy") between the optical axis 806 of the optical system and the center of the spherical-shaped semiconductor is present, the distance from the principle plane of an object lens, represented in FIGS. 8 and 9 as a plane P1, to the surface of the spherical shaped semiconductor 804 becomes Z0+dz1 at one point, and Z0−dz2 at another point, compared to the proper distance of Z0. During exposure, such a difference of distance can cause the image of the circuit pattern projected onto the surface of the spherical shaped semiconductor to become unclear.

Another problem associated with the above-described positioning process is that it is not possible to correction any detected position deviation once the spherical shaped semiconductor is mounted on the support stand and positioned in the exposure apparatus. That is, after the spherical shaped semiconductor is placed on the support stand and it is positioned within the exposure apparatus, there is a possibility that a position deviation may subsequently occur. The size of this position deviation depends, at least in part, on the precision of the construction of the mechanism that moves the support stand, making it extremely difficult to complete eliminate this possible movement.

Hence, there is a need for a system and method that detects and/or corrects position deviations between the optical axis of an optical system, such as an exposure apparatus, and the center of a spherical shaped object, such as a spherical shaped semiconductor, that does not rely on an alignment mark formed on the surface of the object. There is additionally a need for a system and method that detects and/or corrects position deviations between the optical axis of an optical system and the center of a spherical shaped object after the object is positioned within an exposure apparatus. The present invention addresses one or more of these needs.

SUMMARY OF THE INVENTION

In one exemplary embodiment, a system for detecting position deviations of an object having a curved surface includes a first lens, a first body, an image formation device, and a moveable support. The first lens has a first optical axis and a principle plane and is positioned to receive and transmit therethrough light reflected from the curved surface. The first body has at least a portion thereof that is substantially transparent to light and is positioned proximate the first lens and is configured such that the first optical axis extends therethrough, whereby at least a portion of the reflected light passes through the substantially transparent portion of the first body. The image formation device is positioned to receive the reflected light transmitted through the first lens and the substantially transparent portion of the first body and is operable to form a reflected image based on the received reflected light. The moveable support is configured to support the object and is operable to move the object in at least a first axis that is parallel to the first optical axis, whereby the object is moveable between at least two positions relative to the principle plane of the first lens.

In another exemplary embodiment, a method of determining a position deviation of an object having a curved surface includes illuminating at least the curved surface, and passing light that is reflected off of the illuminated curved surface through a first lens having a first optical axis and a first body having at least a portion thereof that is substantially transparent to light. An image having a substantially central portion is formed on a surface using the reflected light. The position deviation is determined based on a position of the substantially central portion of the formed image relative to the first optical axis.

BRIEF DESCRIPTION OF THE DRAWINGS

FIGS. 4A and 4B illustrates the position deviation detection system of FIG. 2 when the system is configured for position deviation detection;

DETAILED DESCRIPTION OF THE DRAWINGS

Figure 1:
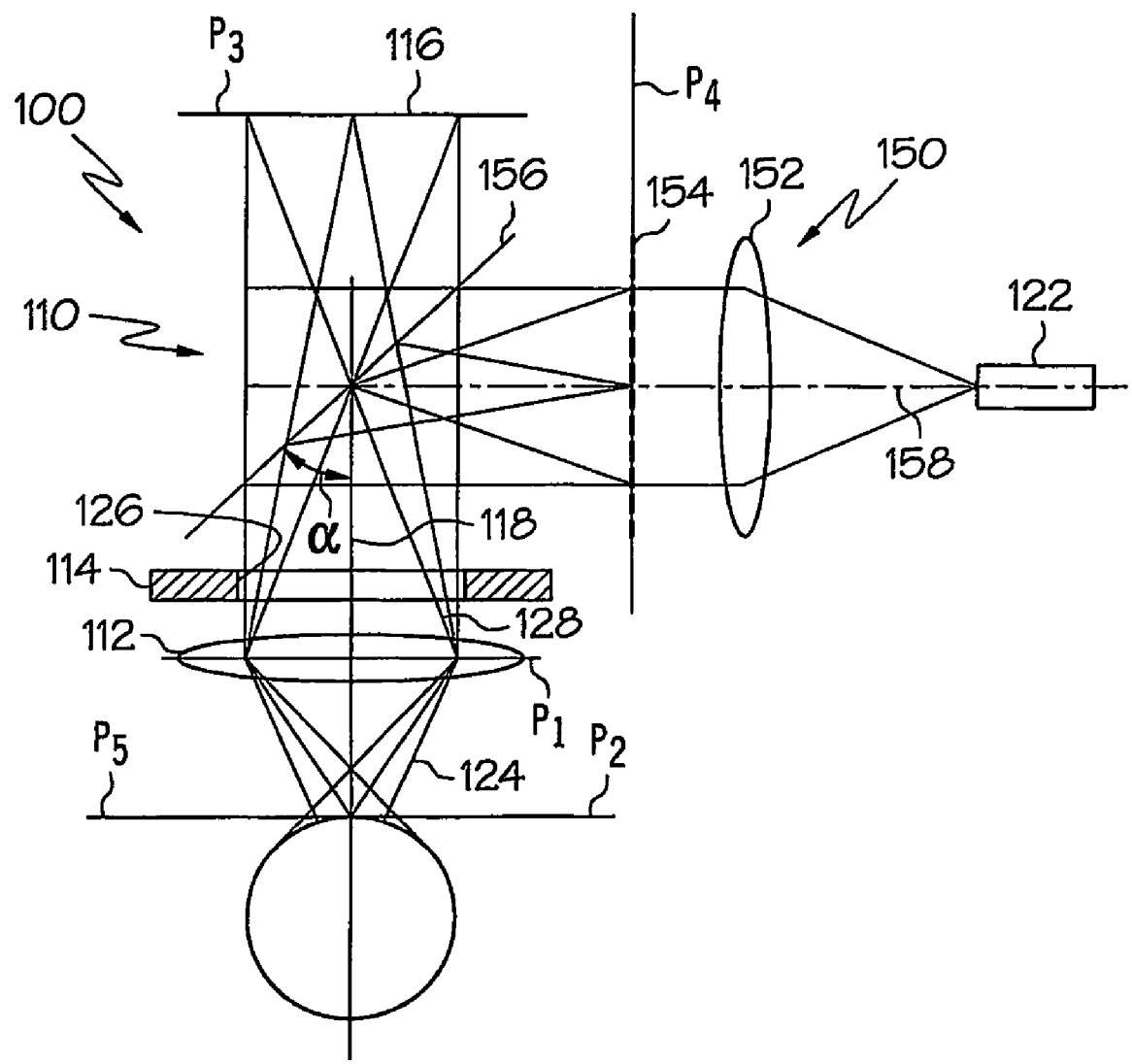
FIG. 1 illustrates an exemplary position deviation detection system according to a particular preferred embodiment.

An optical system 100 that includes both a position deviation detection system 110 and an exposure system 150 is shown in FIG. 1. In the depicted embodiment, the position deviation detection system includes a first lens 112, a stop ring 114, and an image formation device 116, all positioned along a first optical axis 118. The first lens 112 is preferably a convex lens having at least a principal plane P1. As will be described more fully below, the first lens 112 functions to converge light that is transmitted from a light source 122, via the stop ring 114, onto a curved observation surface 124. The first lens 112 also converges light that is reflected from the curved observation surface 124 onto the image formation device 116, via the stop ring 114.

The stop ring 114 is positioned adjacent the first lens 112. In the depicted embodiment, the stop ring 114 is positioned on the same side of the first lens 112 as the image formation device 116, and includes a substantially circular inner circumferential surface 126 that forms an opening 128 through the stop ring 114. It will be appreciated that the stop ring 114 may be positioned on either side of the first lens 112. The stop ring 114 has at least two functions. The first function of the stop ring 114 is as a stop for adjusting the depth of field of the first lens 112. The second function of the stop ring 114, which is described in more detail further below, is as a "virtual alignment mark" for displaying the position of the center of the curved observation surface 124 relative to the optical axis 118 of the position deviation detection system 110. It will be appreciated that the stop ring 114 need not include the opening 128, but may instead have at least a portion that is substantially transparent to the reflected light. It will also be appreciated that the stop ring 114 may be formed of various materials including, but not limited to, metal, plastic, resin, or paper. A portion of the stop ring surface may be blackened and/or its surface may be microscopically roughened.

With the above-described configuration, light transmitted from the light source 122 is directed toward, and passes through, the stop ring 114 and the first lens 112. Because it is a convex lens, the first lens 112 causes the transmitted light to converge from the principle plane P1 toward a first image plane P2 as it approaches the spherical observation surface 124. When the spherical observation surface 124 is illuminated with this converged transmitted light, the spherical observation surface 124 reflects at least some of the transmitted light back toward the first lens 112. This reflected light passes back through the first lens 112 and the stop ring 114, forming a reflected image at a second image plane P3. When the position of the image formation device 116 corresponds to this second image plane P3, the reflected image is projected onto the image formation device 116. In the depicted embodiment, the image formation device 116 is a semi-transparent screen. It will be appreciated that the position and magnification of the image projected onto the image formation device 116 is established based on the distance between the first lens 112 and the curved observation surface 124, and on the focal length of the first lens 112. It will additionally be appreciated, and will be discussed in more detail below, that the particular image projected onto the image formation device 116 depends upon the position of the curved observation surface 124 relative to the first lens' principle plane P1, and upon the curvature of observation surface 124.

As FIG. 1 additionally depicts, the optical system 100 may additionally include an exposure system 150. In the depicted embodiment, the exposure system 150 includes the light source 122, a second lens, 152, a mask 154, and a half mirror 156, all positioned along a second optical axis 158. It is noted that the light source 122 used in the exposure system 150 is, in the depicted embodiment, the same light source 122 that is used in the position deviation detection system 110. It will be appreciated that the two systems need not share the same light source, and that two different light sources could be used. However, for efficiency and compactness of equipment size, the two systems preferably share the same light source.

The light source 122 generates diffuse light. Therefore, in the depicted embodiment, the second lens 152, which is a condensing lens, converts the diffuse light into parallel light rays. This parallel light illuminates the mask 154, which has a prescribed circuit pattern (not illustrated) drawn on it. As such, the parallel light is transmitted or blocked in accordance with this circuit pattern. The half mirror 156 is configured at a predetermined angle ($\alpha$) relative to the optical axis 118. This predetermined angle ($\alpha$) may be selected from any one of numerous angles, depending upon the configurations of the position deviation detection system 110 and the exposure system 150. In the depicted embodiment, the predetermined angle ($\alpha$) is approximately 45 degrees. As with most half mirrors, the half mirror 154 in the exposure system 150 functions to separate the optical path of the position deviation detection system 110 and the optical path of the exposure system 150 from one another, even though at least a portion of the optical axes of the two systems may overlap. It will be appreciated that the optical system 100 may also be configured without the second lens 152.

Hence, when the exposure system 150 is being used, light from the light source 122 that is transmitted through second lens 152 and the mask 154 is reflected by the half mirror 156. The mask 154 is positioned at a first object plane P4 of the first lens 112. Thus, the light reflected by the half-mirror 156 is transmitted through the stop ring 114 and first lens 112, and forms an image of the circuit pattern on the mask 154 at the first image plane P2 (which corresponds to the object plane of the mask 154). If the position of the curved observation surface 124 coincides with the first image plane P2 (as illustrated in FIG. 1), the circuit pattern will be projected onto the curved observation surface 124.

As was noted above, the curved observation surface 124 will reflect at least some of the light transmitted onto it through the first lens 112. This reflected light forms an image at the second image plane P3, which preferably coincides with the image formation device 116. As was also noted above, the particular image formed at the second image plane P3 will depend, at least in part, on the position of the curved surface 124 relative to the first lens' principle plane P1. In particular, when the curved surface 124 is positioned at the first image plane P2, this position coincides with a second object plane P5 (as shown in FIG. 1) of the first lens 112, and the image formed at the second image plane P3 will be the curved surface 124. When the curved surface 124 is moved relative to the first image plane P2, the second object plane P5 also moves, as will be described more fully below, and the image formed at the second image plane P3 changes (this configuration is not shown in FIG. 1). For example, if the curved surface 124 is moved toward the first lens 112, such that the second object plane P5 corresponds to the stop ring 114, then an image of the stop ring 114 forms at the second image plane P3.

Figure 2:
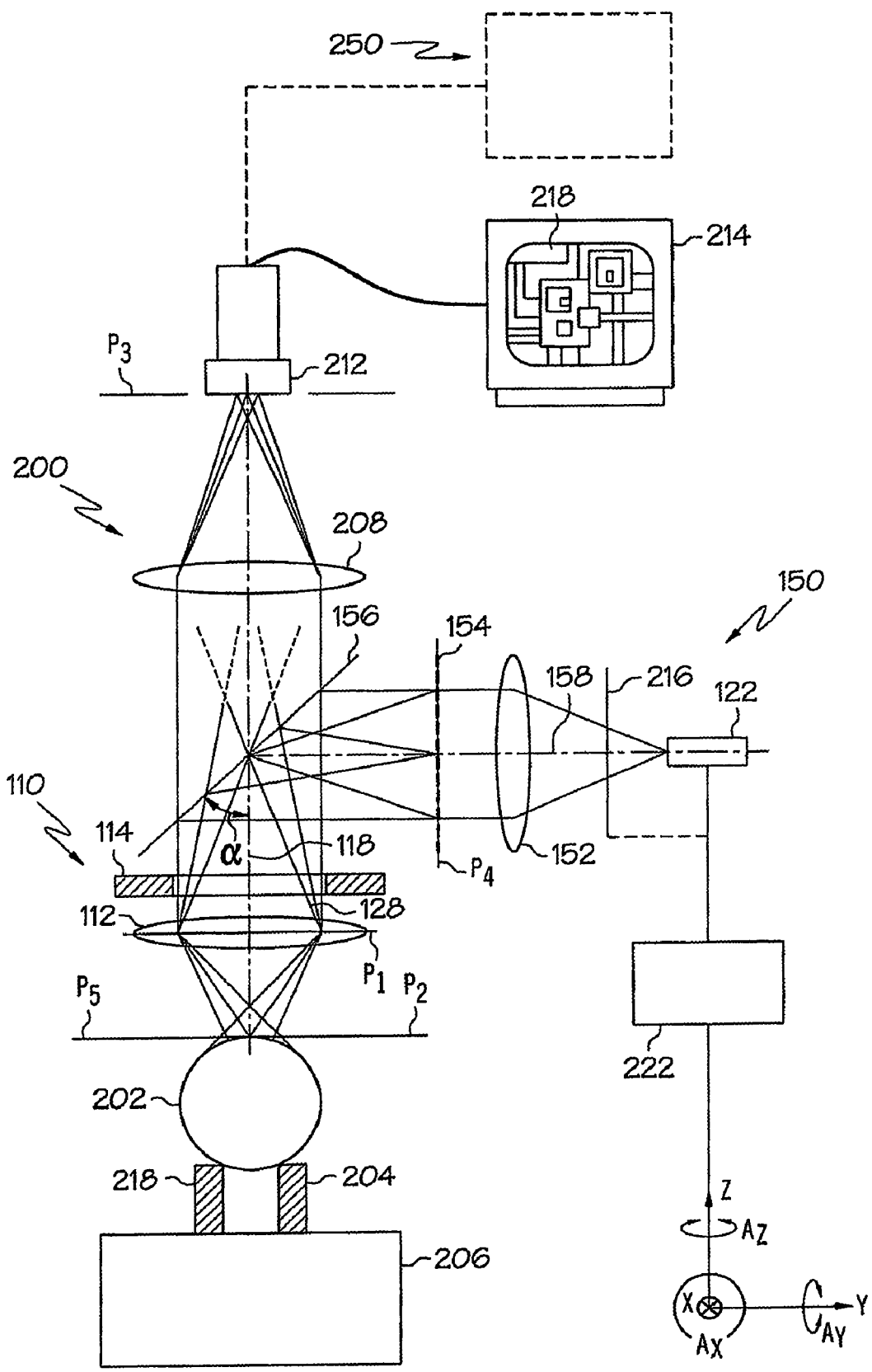
FIG. 2 depicts the position deviation detection system of FIG. 1 with additional detection and display components included therewith.

Turning now to FIG. 2, a particular embodiment of an optical system 200 will be described. In particular, the depicted optical system 200 is used to detect and correct position deviations of spherical shaped semiconductors 202, and to expose the spherical shaped semiconductors 202 for circuit pattern formation on the surfaces thereof. It is noted that in the following description, like reference numerals refer to like parts of the optical system depicted in FIG. 1, and described above.

In addition to the components described and depicted in FIG. 1, the optical system 200 depicted in FIG. 2 includes a support 204, a movement mechanism 206, a third lens 208, an image forming CCD element 212, a display 214, and a filter 216. The support 204 is a substantially hollow, tube-shaped device that has a first end coupled to the movement mechanism 206 and a second end 218 on which a spherical shaped semiconductor is supported. In a particular preferred embodiment, after the spherical shaped semiconductor 202 is placed on the support 204, the inside of the support 204 is evacuated by, for example, a pump (not illustrated). With the inside of the support 204 at a vacuum, the spherical shaped semiconductor 202 is held in place on the support 204.

The support 204, as noted above, is coupled to the movement mechanism 206. It is noted that the movement mechanism 206 is configured such that the spherical shaped semiconductor 202 may be moved both translationally and rotationally. That is, it may be translated in the x-, y-, and z-axes, and rotated in the direction Ax-, Ay-, and Az-axes, all of which are depicted in FIG. 2. It is noted that the movement mechanism 206 may be any one of numerous devices known in the art for providing this functionality, and that such a description is not necessary to an understanding of the present invention. Hence, a detailed description of the movement mechanism 206 will not be provided.

The third lens 208, the image forming CCD element 212, and the display 214 comprise the image formation device for the optical system 200. Generally, the CCD element 212 optically functions similar to the semi-transparent screen 116 depicted in FIG. 1. Because the area of the CCD element 212 is relatively small, the third lens 208 converges the luminous flux that is reflected from the spherical shaped semiconductor 202, and through the first lens 112 and stop ring 114 toward the second image plane P3. It should be appreciated that the magnification of the image that is formed on the CCD element 212 may be determined by selecting an appropriate combination of focal point distances of the first 112 and third 208 lenses. The image formed on the CCD element 212 is converted into electrical data, which is transmitted to the display 214. The display 214 receives the electrical data and displays the image on a screen 218.

The filter 216 is moveable into, and out of, the second optical axis 158. The filter 216 may be moved by any one of numerous manual or automated devices and mechanisms 222. The particular device or mechanism used to move the filter 216 is not necessary to an understanding of the present invention and will, therefore, not be described further. The filter 216 functions to eliminate the particular light frequency(lies) to which the photoresist applied to the spherical shaped semiconductor 202 is sensitive. For example, if the photoresist is sensitive to ultraviolet (UV) light frequencies, the filter 216 will eliminate these frequencies while allowing other light frequencies to pass. Thus, when the position deviation detection system 110 is being used to detect and correct position deviations, the filter 216 is moved into the second optical axis 158. As a result, the spherical shaped semiconductor 202 may be illuminated by the light source 122 with light frequencies that do not react with the photoresist. Thereafter, following any position deviation corrections, the filter 216 is moved out of the second optical axis 158, which allows the exposure operation to be properly completed.

Having described the configuration of optical system 100, including both the position deviation detection system 110 and the exposure system 150, and the functions of the various components that make up these systems, a description of the method by which the position deviation detection system 110 detects a position deviation will now be provided. In doing so, the method will first be described generally, followed by a more detailed description.

First, with the light source 122 emitting light rays and the filter 216 positioned in the second optical axis 158, the movement mechanism 206 moves the spherical shaped semiconductor 202 in the z-axis. When the surface of the spherical shaped semiconductor 202 reaches a first predetermined position, which coincides with the first image plane P2, the surface of the spherical shaped semiconductor 202 is reflected onto the CCD element 212 and is displayed on the display screen 218. Thereafter, the spherical shaped semiconductor is moved in the z-axis closer to the first lens 112. At a second predetermined position, the image of the stop ring inner circumferential surface 126 that is reflected by the surface of the spherical shaped semiconductor 202 is instead reflected onto the CCD element 212 and is displayed on the display screen 218. Depending on the particular structure of the stop ring 114, the image of the stop ring 114 may be seen as a "shadow" on the display screen 218, and the image of the opening formed by the inner circumferential surface 126 may be seen as a "circle of light" on the display screen 218. No matter the case, if the center of this reflected image 402 is displayed in the center of the display screen 218 (see FIG. 4A), then the center of the spherical shaped semiconductor 202 is aligned with the first optical axis 118, and there is no position deviation. Conversely, if the center of this reflected image 402 is displayed in an off-center position of the display screen (see FIG. 4B), then the center of the spherical shaped semiconductor 202 is not aligned with the first optical axis 118, and there is a position deviation. If a position deviation is detected, the movement mechanism 206 can then move the spherical semiconductor 202 in the appropriate axes to correct the position deviation. This position deviation correction may be carried out by manual or automatic manipulation of the movement mechanism 206.

It is additionally noted that the actual amount of position deviation is proportional to the amount of position deviation that is displayed on the display screen 218. Thus, the actual amount of position deviation can be automatically measured using the displayed position deviation. To do so, an image processing system 250, which is depicted in phantom in FIG. 2, may be added to the optical system 100. The image processing system 250 may be any one of numerous such systems known in the art. In a particular preferred embodiment, the system disclosed in U.S. Pat. No. 6,148,270, may be used. With this system 250, the reflected image 402 with no position deviation is recorded. Then, the image 402 with a position deviation is read into the image processing system 250. The image processing system 250 then determines the actual amount of position deviation by comparing the two images.

Figure 3:
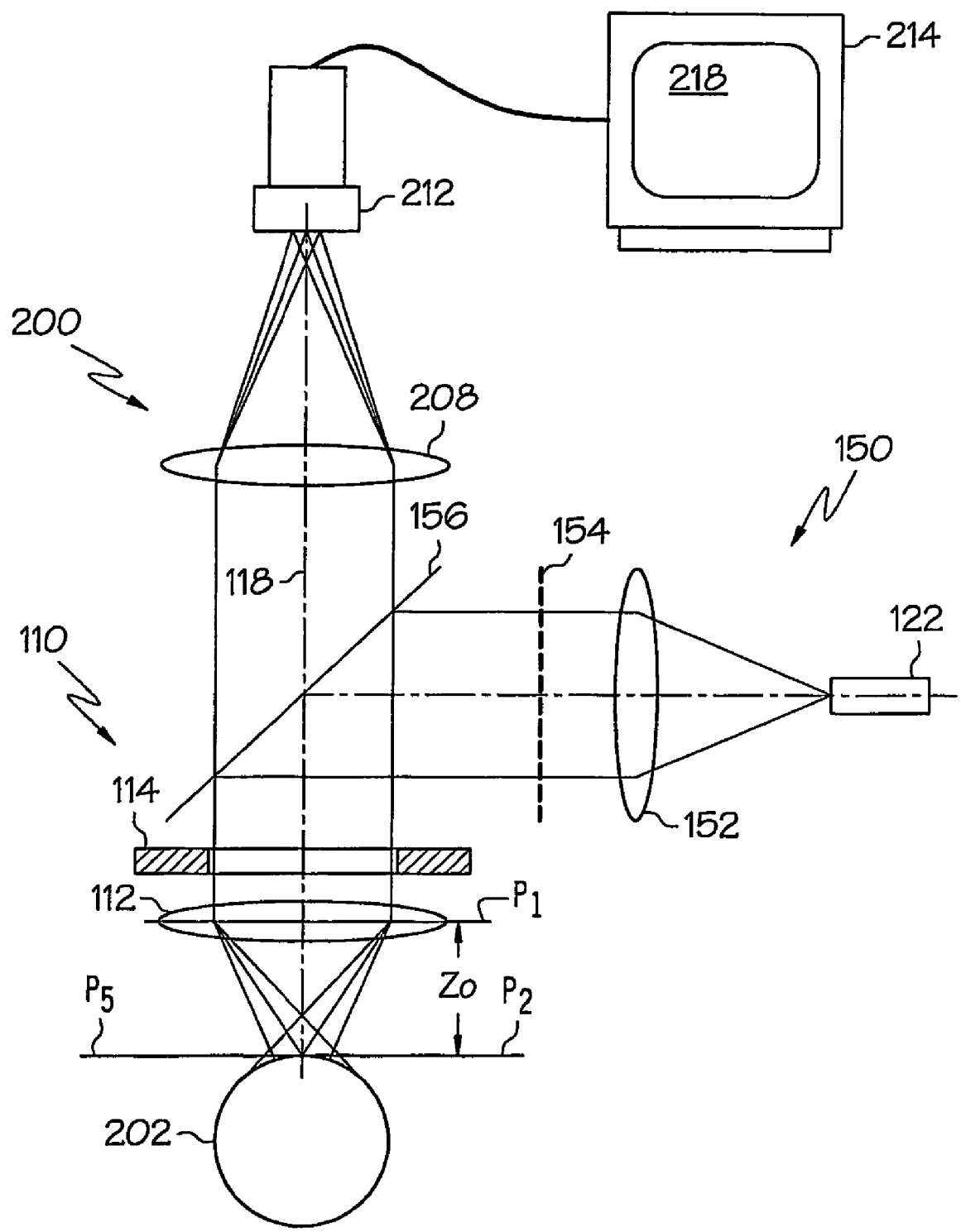
FIG. 3 illustrates the position deviation detection system of FIG. 2 when the system is configured for exposure.

Turning now to FIGS. 3-6, a more detailed description will be provided as to why the above-described method for determining position deviation works in the manner described. First, FIG. 3 shows a state where the spherical shaped semiconductor 202 is positioned such that its surface coincides with the first image plane P2 ($z_0$). Thus, the surface of the spherical shaped semiconductor 202 is reflected onto the CCD element 212 and is displayed on the display screen 218. It should be noted that the particular spherical shaped semiconductor 202 shown in FIG. 3 does not yet have a circuit pattern formed thereon. Hence, a blank image is displayed on the display screen 218.

Figure 5:
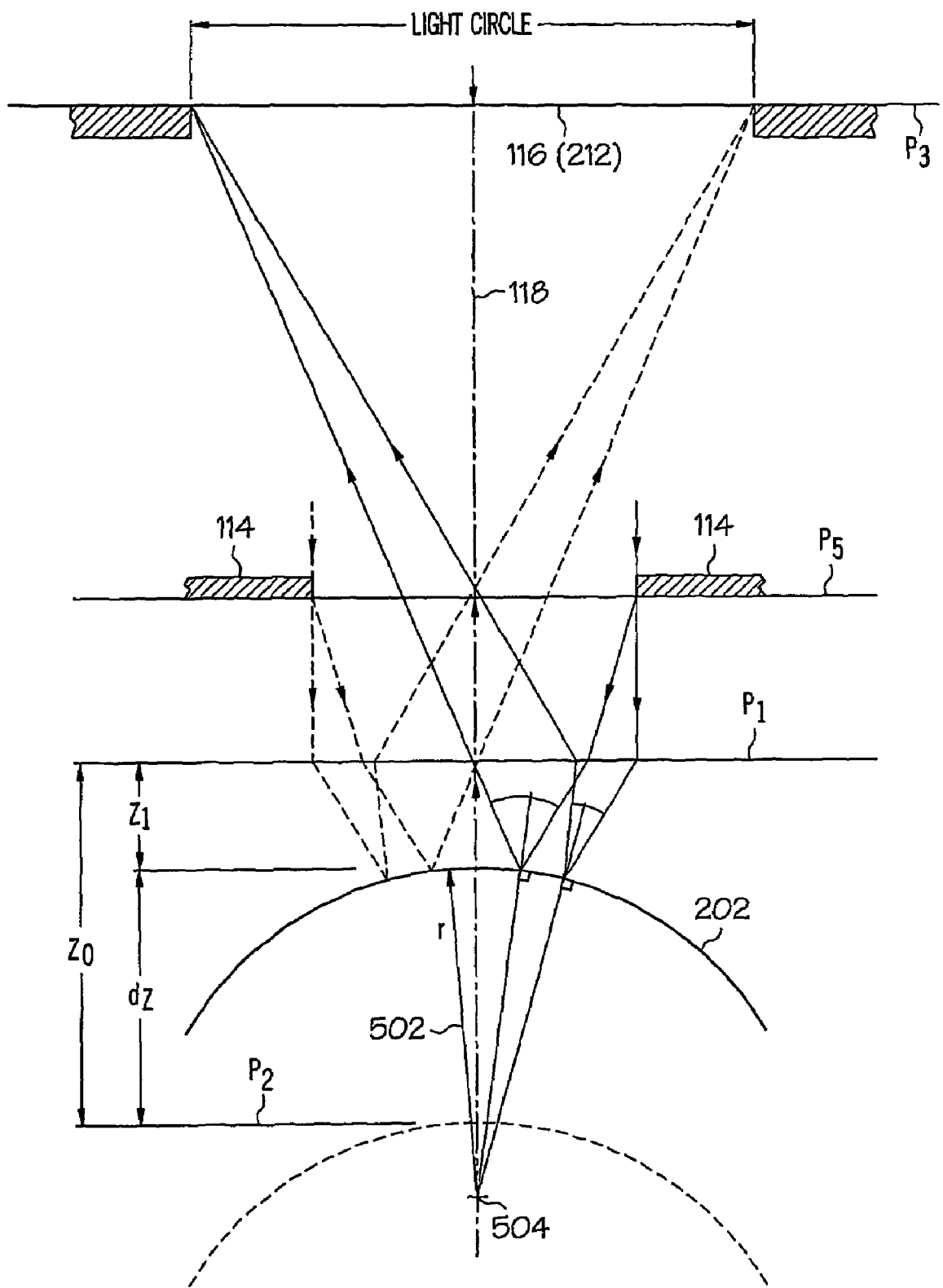
FIG. 5 is a simplified representation of the position deviation detection system used to illustrate the principle of the present invention when there is no position deviation.
Figure 6:
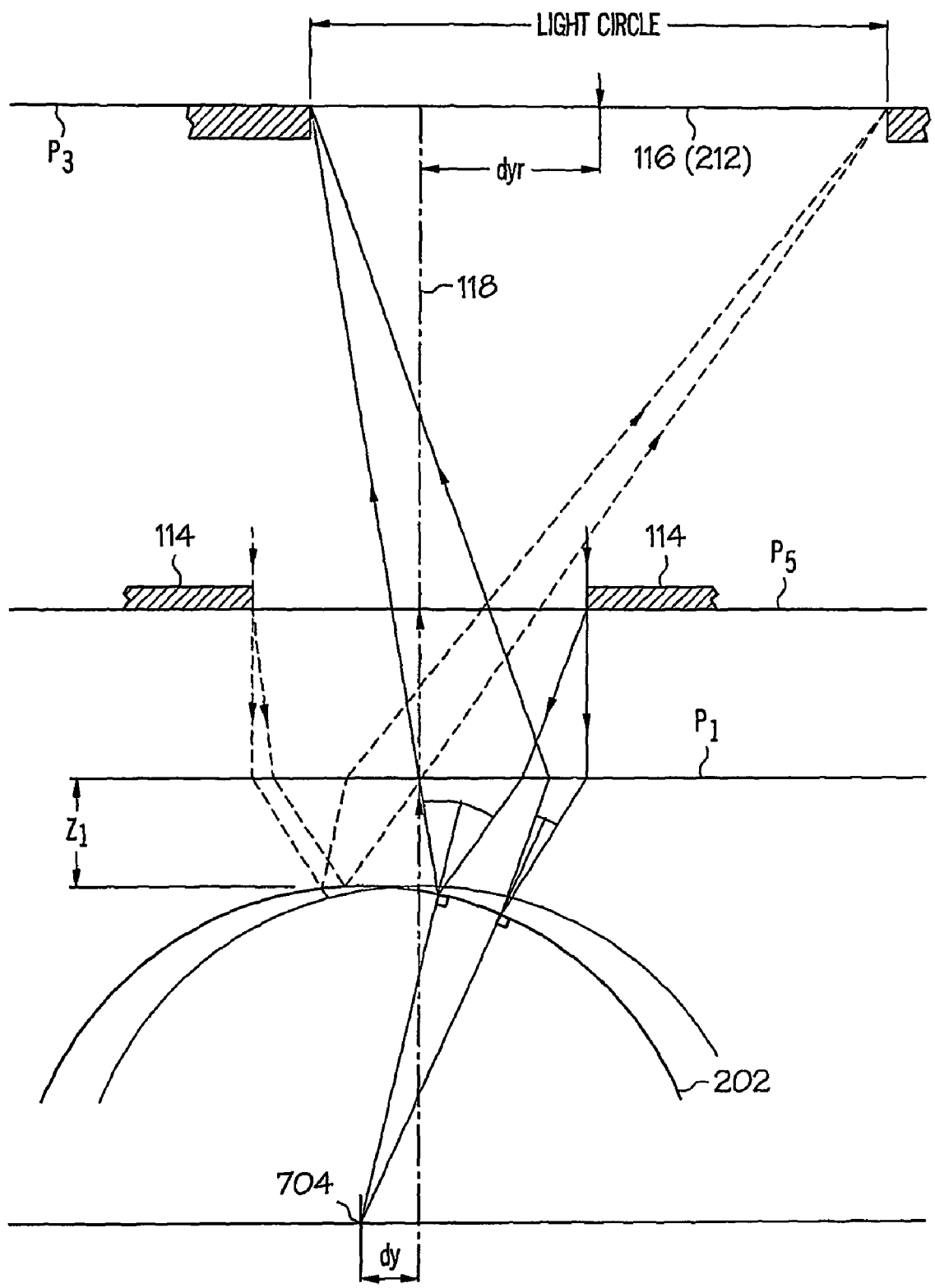
FIG. 6 is a simplified representation of the position deviation detection system used to illustrate the principle of the present invention when there is a position deviation.

Next, FIGS. 4-6 show a state where the surface of the spherical shaped semiconductor 202 has been moved to a second position ($z_1$) that is closer to the first lens 112, for performing position deviation detection. In this position, the second object plane P5 of the first lens 112 no longer coincides with the first image plane P2 and the surface of the spherical shaped semiconductor 202. Instead, the second object plane P5 coincides with the stop ring 114. As shown more clearly in FIGS. 5 and 6, the surface of the spherical shaped semiconductor 202 behaves like a convex mirror, having a center of curvature of "r" and a focal point 502 located at "r/2." For clarity, in FIGS. 5 and 6, the third lens 208 is omitted, since it functions merely to adjust image magnification on the CCD element 212. The first lens 112 is depicted as the principal plane P1, and the CCD element 212 is depicted as the second image plane P3. As is generally known in the art, the images formed by a convex mirror are sometimes referred to as "virtual images" because the images appear where the light rays reflected by the mirror seem to diverge from the focal point behind the mirror, which, in this instance is the focal point 502 within the spherical shaped semiconductor. Thus, as was noted above, as the position of the spherical shaped semiconductor 202 changes in the z-axis, for example, from a first position $z_0$ to a second position $z_1$ ($dz=|z_1-z_0|$), the position of the second object plane P5 also changes.

For ease of explaining the principle of virtual images, it is possible to consider the spherical shaped semiconductor 202 as a concave lens, which is optically equivalent to a convex mirror. Thus, in FIGS. 4A and 4B the spherical shaped semiconductor 202 is replaced with a convex lens 404, which produces a virtual image on the lower side (as viewed in FIG. 4) of the convex lens. In FIG. 4A, the virtual image 406, which is illustrated using solid lines, occurs when the center of the spherical shaped semiconductor 202 coincides with the first optical axis 118. Thus, the virtual image 406 is symmetric to the real image formed on the first optical axis 118. This same configuration is what is illustrated in FIG. 5. That is, the center 504 of the spherical shaped semiconductor 202 is aligned with the first optical axis 118. Thus, light from the light source 122 passes through the stop ring 114 and first lens 112 (e.g., P1), is reflected by the spherical shaped semiconductor 202, back through the first lens 112 and stop ring 114, and forms an image on the CCD element 212 (e.g., P3), via the third lens 208 (not illustrated in FIG. 5). Because the center of the stop ring 114 and the center 504 of the spherical shaped semiconductor 202 are both aligned along the first optical axis 118, the reflected image formed on the CCD element 212 (e.g., P3) and displayed on the display screen 218 is centered, as depicted in FIG. 4A.

Figure 8:
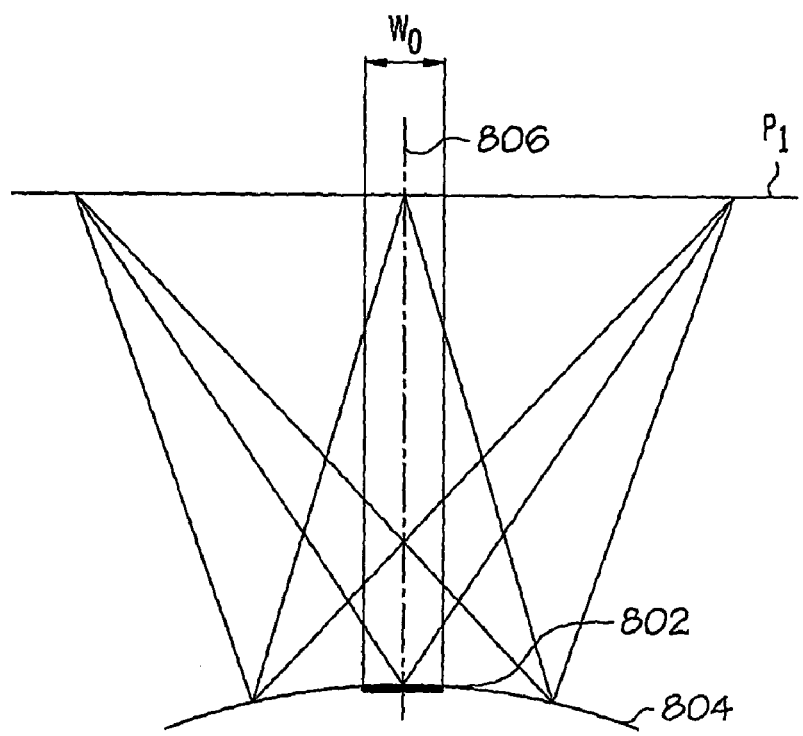
FIG. 8 illustrates a spherical shaped semiconductor that has a conventional alignment mark and when there is no position deviation.
Figure 9:
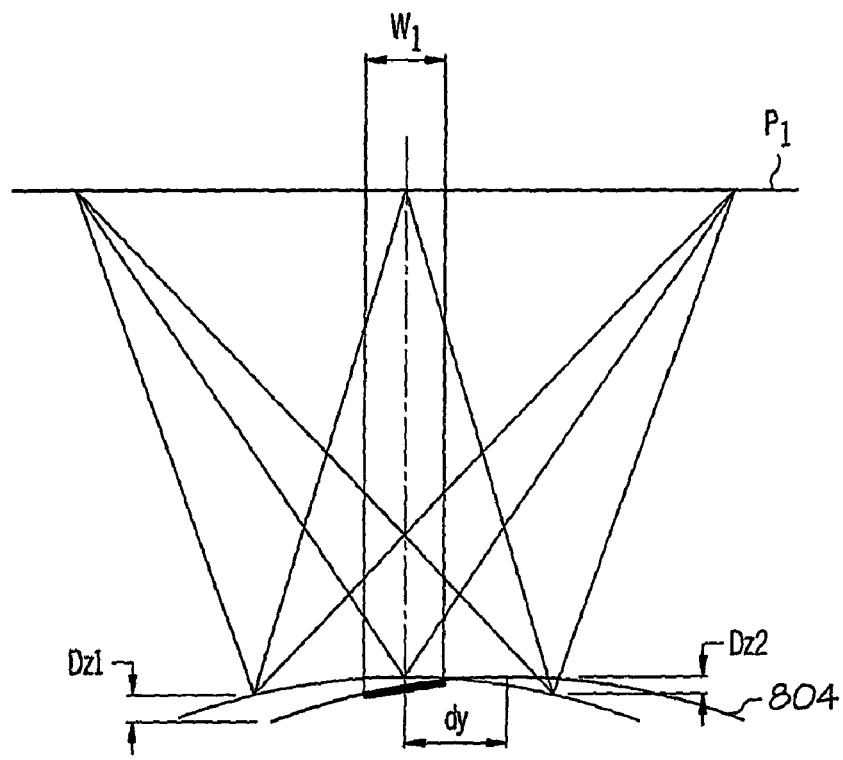
FIG. 9 illustrates the spherical shaped semiconductor of FIG. 10 when there is a position deviation.

The virtual image 408 in FIG. 4B, occurs when there is a deviation between the center of the spherical shaped semiconductor 202 and the first optical axis 118. In this case, the virtual image 408 has an inclination angle ($\beta$) relative to the first optical axis 118. In this manner, the position deviation of the spherical shaped semiconductor 202 is observed as a deviation of the virtual image 408 from first optical axis 118. This same configuration is what is illustrated in FIG. 6. That is, the center 504 of the spherical shaped semiconductor 202 is displaced from the first optical axis 118 by an incremental amount ("dy"). Again, light from the light source 122 passes through the stop ring 114 and first lens 112 (e.g., P1), is reflected by the spherical shaped semiconductor 202, back through the first lens 112 (e.g., P1) and stop ring 114, and forms an image on the CCD element 212 (e.g., P3), via the third lens 208 (not illustrated in FIG. 8). In this case, however, because the center 504 of the spherical shaped semiconductor 202 is displaced from the first optical axis 118, the image formed on the CCD element 212 (e.g., P3) and displayed on the display screen 218 is not centered. Instead, as shown in FIGS. 4 and 6B the displayed image 402 is deviated from center by an amount ("dyr") that corresponds to the actual deviation of the spherical shaped semiconductor 202.

As was previously noted, the position of the spherical shaped semiconductor 202 may be corrected each time the above-described position deviation detection method is performed. By detecting and correcting the position of the spherical shaped semiconductor 202, the spherical shaped semiconductor 202 can be positioned with a substantially high degree of precision. After the spherical shaped semiconductor 202 is properly positioned, as shown in FIG. 2, the filter 216 may be removed from the second optical axis 158 and, if not done so already, the mask 154 is then positioned in the second optical axis 158. This allows the UV rays emitted by the light source 122 to be transmitted through the mask 154, reflected off the half mirror 156, and to pass through the stop ring 114 and first lens 112, to thereby project a wiring pattern on the surface of the spherical-shaped semiconductor 202. Since the first optical axis 118 and the center of the spherical shaped semiconductor 202 coincide, the wiring pattern projected on the surface of the spherical shaped semiconductor 202 is not warped.

Figure 7:
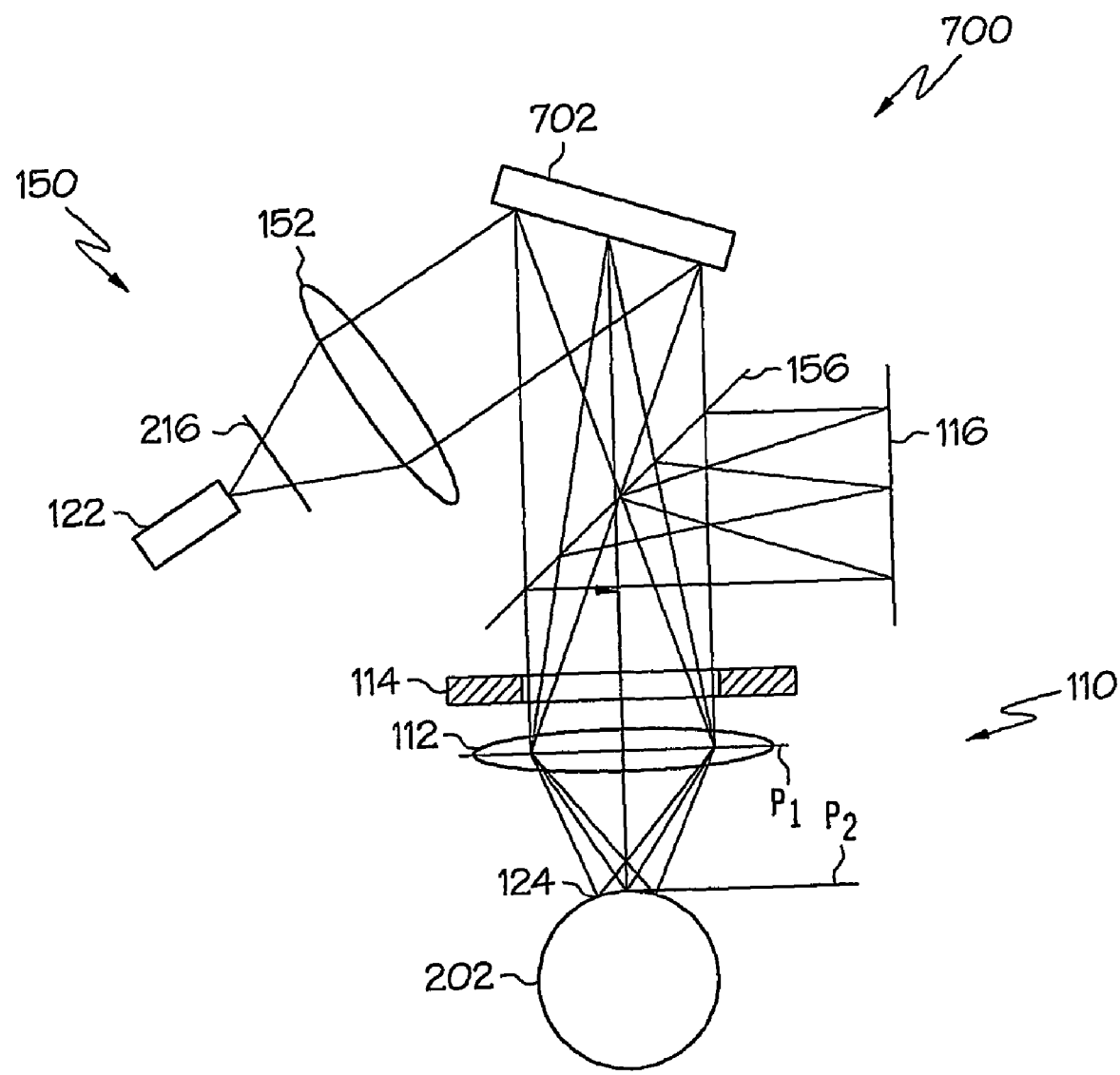
FIG. 7 illustrates an exemplary position deviation detection system according to a particular alternative embodiment.

An alternate embodiment of an optical system is depicted in FIG. 7. The system 700 illustrated in FIG. 7 is similar to that illustrated in FIG. 1, with the following differences: (1) the optical system of the position deviation detection system 110 has been bent by the half mirror 156; (b) a pattern generator 702 is used to provide a mask in the exposure system 150; and (c) the position of the light source 122 is different. The pattern generator 702 may be a conventionally known generator, in which multiple mirrors are arranged in a grid, and are on-off controlled. An example of such a pattern generator is sold by Texas Instruments under the product names Digital Mirror Device ("DMD") and Digital Light Processor ("DLP"). A photolithography technique that employs this type of pattern generator is disclosed in U.S. Pat. No. 6,251,550. Because the position deviation detection method in this embodiment is the same as that in the previous embodiment, further discussion thereof is omitted.

It should be appreciated that the present invention is not limited to configurations that include the exposure systems 150 illustrated in FIGS. 1, 2 and 7, but could be configured to include only the position deviation detection system 110. It will be further appreciated that if the system is indeed configured solely as a position deviation detection system 110, the position of the light source 110 may be varied from the positions shown in FIGS. 1, 2 and 7. For example, the light source 122 may be positioned proximate the stop ring 114 at any one of numerous positions off of the first optical axis 118, so long as the lower surface of the stop ring 114 is illuminated.

It will additionally be appreciated that the present invention is not limited to use of the stop ring 114 for providing a "virtual mark." Examples of other devices include, but are not limited to, a reticule, a relatively thin stick, or a relatively thin slab. In addition, the present invention is not limited to detecting position deviations relative to the first optical axis 118. For example, position deviations may be detected on one side of the first optical axis 118. Moreover, the position of the device that provides the "virtual mark" relative to the first optical axis 118 may also be varied. For example, it may be positioned anywhere within the range of the object plane distance of the first lens 112. It will be further appreciated that the first 112, second 152, and third 218 lenses may each be formed as single pieces, or may be formed as an assembly of lenses that together function as a convex lens.

In addition to the varying configurations of the system described immediately above, it will be appreciated that the position deviation detection system and method disclosed herein is not limited to spherical shaped semiconductors, or other objects that are spherical shaped or have surface contours, or portions thereof, that are spherical. Rather, the shape of the object need only have a surface, or portion thereof, with a curved contour, which may be symmetric or axisymmetric. For example, position deviations of objects shaped as a column, a rotating elliptical surface, a rotating parabolic surface, and so on, may also be detected.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

I claim:

1. A system for detecting position deviations of an object having a curved surface, comprising:
   a first lens having a first optical axis and a principal plane, the first lens positioned to receive and transmit therethrough light reflected from the curved surface;
   a first body having at least a portion thereof that is substantially transparent to light, the first body being positioned proximate the first lens and configured such that the first optical axis extends therethrough, whereby at least a portion of the reflected light passes through the substantially transparent portion of the first body;
   an image formation device positioned to receive the reflected light transmitted through the first lens and the substantially transparent portion of the first body and operable to form a reflected image based on the received reflected light; and
   a moveable support configured to support the object and operable to move the object in at least a first axis that is parallel to the first optical axis, whereby the object is moveable between at least two positions relative to the principal plane of the first lens.

2. The system of claim 1, further comprising:
   a light source operable to supply light,
   wherein the first lens is positioned to receive the light supplied by the light source and transmit the received light onto the curved surface.

3. The system of claim 1, wherein the image formation device comprises:
   a CCD element operable to receive the reflected light and convert it into electrical data representative of the reflected image; and a display coupled to receive the electrical data and operable to display the reflected image.

4. The system of claim 1, wherein:
the curved surface has a center of curvature; and
the reflected image has a substantially central portion that is formed on the image formation device at a position that is representative of a position deviation of the center of curvature relative to the first optical axis.

5. The system of claim 4, wherein the moveable support is further operable to move the object to thereby substantially eliminate any position deviation.

6. The system of claim 1, further comprising:
a light source operable to supply light along a second optical axis;
a half-mirror configured at a predetermined angle relative to the first and second optical axes and operable to reflect the supplied light along the first optical axis toward the first lens and to allow the reflected light to pass therethrough toward the image formation device.

7. The system of claim 6, further comprising:
a mask having at least a portion thereof positioned between the light source and the half-mirror along the second optical axis, whereby a circuit pattern is formed on the curved surface.

8. The system of claim 7, further comprising:
a light filter moveable into and out of the second optical axis between the light source and the mask, the light filter operable to remove predetermined light frequencies transmitted from the light source.

9. The system of claim 7, wherein the mask is a pattern generator.

10. The system of claim 7, further comprising:
a second lens positioned between the light source and the mask along the second optical axis.

11. The system of claim 1, further comprising:
a third lens positioned between the first body and the image formation device along the first optical axis.

12. The system of claim 11, wherein the first and third lenses are each convex lenses.

13. The system of claim 1, wherein the image formation device is positioned along a third optical axis having a predetermined angle relative to the first optical axis, and wherein the system further comprises:
a half mirror configured at a predetermined angle relative to the first and third optical axes and operable to reflect the light that is reflected from the curved surface along the third optical axis toward the image formation device.

14. The system of claim 13, further comprising:
a light source operable to supply light,
wherein the half mirror is further operable to allow the supplied light to pass therethrough along the first optical axis toward the first lens.

15. The system of claim 1, wherein the first body is a stop ring that includes an opening formed therein that is substantially circular in shape and has a predetermined diameter.

16. A method of determining a position deviation of an object having a curved surface, comprising:
illuminating the curved surface;
passing light that is reflected off of the illuminated curved surface through a first lens having a first optical axis and a first body having a portion thereof that is substantially transparent to light;
forming an image having a substantially central portion on a surface using the reflected light;
determining the position deviation based on a position of the substantially central portion of the formed image relative to the first optical axis; and
displaying the position deviation on a display screen.

17. The method of claim 16, further comprising:
illuminating the curved surface with light from a light source.

18. The method of claim 17, further comprising:
passing the light through the first lens and onto the curved surface.

19. The method of claim 16, further comprising:
displaying the reflected image on a display device.

20. The method of claim 16, wherein:
the curved surface has a center of curvature, and
wherein the image is formed at a position that is representative of a position deviation of the center of curvature relative to the first optical axis.

21. The method of claim 16, further comprising:
moving the object to thereby substantially eliminate any position deviation.

22. The method of claim 16, further comprising:
supplying light along a second optical axis;
reflecting the light supplied along the second axis such that the light is supplied light along the first optical axis and is directed toward the curved surface for illumination thereof.

23. The method of claim 22, further comprising:
passing the supplied light through a mask to form a circuit pattern on the curved surface.

24. The method of claim 23, further comprising:
selectively filtering the supplied light before it passes through the mask.

25. The method of claim 22, further comprising:
passing the supplied light through a second lens positioned along the second optical axis.

26. The method of claim 16, further comprising:
passing the reflected light through a third lens that is along the first optical axis.

* * * * *